June 18, 1963 L. A. ULE 3,094,675

DEGENERATIVE FEEDBACK AMPLIFIER UTILIZING ZENER DIODE

Filed May 21, 1956 2 Sheets-Sheet 1

LOUIS A. ULE,
INVENTOR.

BY [signature]

ATTORNEY.

DEGENERATIVE FEEDBACK AMPLIFIER UTILIZING ZENER DIODE

Filed May 21, 1956 2 Sheets-Sheet 2

LOUIS A. ULE,
INVENTOR.

BY [signature]

ATTORNEY.

United States Patent Office 3,094,675

Patented June 18, 1963

3,094,675

DEGENERATIVE FEEDBACK AMPLIFIER UTILIZING ZENER DIODE

Louis A. Ule, Alhambra, Calif., assignor to Gilfillan Bros., Inc., Los Angeles, Calif., a corporation of California Filed May 21, 1956, Ser. No. 587,191
3 Claims. (Cl. 330—110)

This invention relates to amplifiers, and more particularly to electrical circuits including means to provide degenerative feedback to an amplifier at appropriate times to prevent the output of the amplifier from respectively falling below or rising above predetermined low and high levels.

In order to provide such feedback, it has been necessary in the past to provide the feedback to an amplifier through at least one biased rectifier or diode. This means that where it becomes necessary to use several feedback circuits, it also becomes necessary to provide a separate or individual and isolated potential source for each diode employed. This practice obviously is preferably avoided because of the expense involved. In addition, it is always necessary to provide two parallel connected diodes for each amplifier to prevent the output of the amplifier from both falling below and rising above predetermined low and high levels. In this case too, at least one and often two individual and isolated potential sources are additionally required.

The present invention overcomes these and other disadvantages of the prior art by providing, in combination, an amplifier having a feedback path, and at least one p-n junction connected in the feedback path, the junction, for a reverse voltage is greater than a critical reverse voltage being characterized by a substantially constant voltage region. The p-n junction generally comprises an integral body of semi-conductive material, such as silicon, having a layer of p-type material, a layer of n-type material and a transition layer at the interface where a progressive change in type occurs. The type of semi-conductor which has a critical reverse voltage is often called a Zener diode and is described in detail in U.S. Patent No. 2,714,702. The Zener diode is normally electrically equivalent to a conventional high vacuum diode or a crystal rectifier except for the fact that a preassigned voltage, i.e. at a "built in" critical reverse or Zener voltage, the Zener diode conducts heavily. Thus, with the present invention, the critical Zener voltage of a p-n junction diode is effectively employed to obviate the necessity of using a separate biasing potential source. In addition, a Zener diode operates exactly in the same manner as a conventional rectifier when a forward voltage is impressed across it, i.e. it has a very low forward impedance and conducts heavily. Hence, a single Zener diode may be employed in accordance with the invention to prevent the output of an amplifier from both falling below and rising above, respectively, predetermined low and high levels.

It will be obvious to those skilled in the art that a number of other applications of the invention may be also employed. For example, a Zener diode may be employed in a feedback path of an integrating amplifier having a feedback capacitor. The selected minimum and maximum output levels of the integrator or amplifier output voltage may also be adjusted by a level shifting circuit connected to a tap on a common or non-isolated potential source. This is distinguished from the isolated source required in the prior art. That is, the common source may be referenced to the same potential, e.g. ground, as that of the amplifier with which it is used.

It is to be noted that with the use of only one Zener diode, the output voltage of an amplifier or integrator is prevented from falling below zero volts or rising above zero volts, depending upon the direction in which the Zener diode is poled. However, this may be altered by using a level shifting network.

According to one aspect of the invention, the use of a level shifting network may be avoided and its function retained by employing two Zener diodes poled in opposite directions and connected serially in the feedback path of an amplifier. In this case the output of the amplifier is prevented from rising above the Zener voltage of one of the diodes and falling below that of the other.

It is therefore an object of the invention to provide a novel passive feedback circuit for an amplifier to prevent the output of the amplifier from either falling below or rising above predetermined low or high levels.

It is another object of the invention to provide a passive feedback circuit for an amplifier including a single semi-conductor diode to prevent the output of the amplifier from respectively falling below or rising above predetermined low and high levels.

Yet another object of the invention is to provide an amplifier with a novel feedback and level shifting circuits, whereby the output of the amplifier may be prevented from falling below or rising above, respectively, predetermined low and high adjustable levels in a relatively wide range.

A further object of the invention is to provide an amplifier feedback circuit, which, without the use of level shifting networks or isolated bias sources, will prevent the amplifier output from falling below or exceeding selected low and high levels, respectively, less than and greater than zero.

The novel features which are believed to be characteristic of the invention, both as to its organization and method of operation, together with further objects and advantages thereof, will be better understood from the following description considered in connection with the accompanying drawings. It is to be expressly understood, however, that the drawings are for the purpose of illustration and description only and are not intended as a definition of the limits of the invention.

Figures 1, 2, 3, 4, 5, 6, 7:
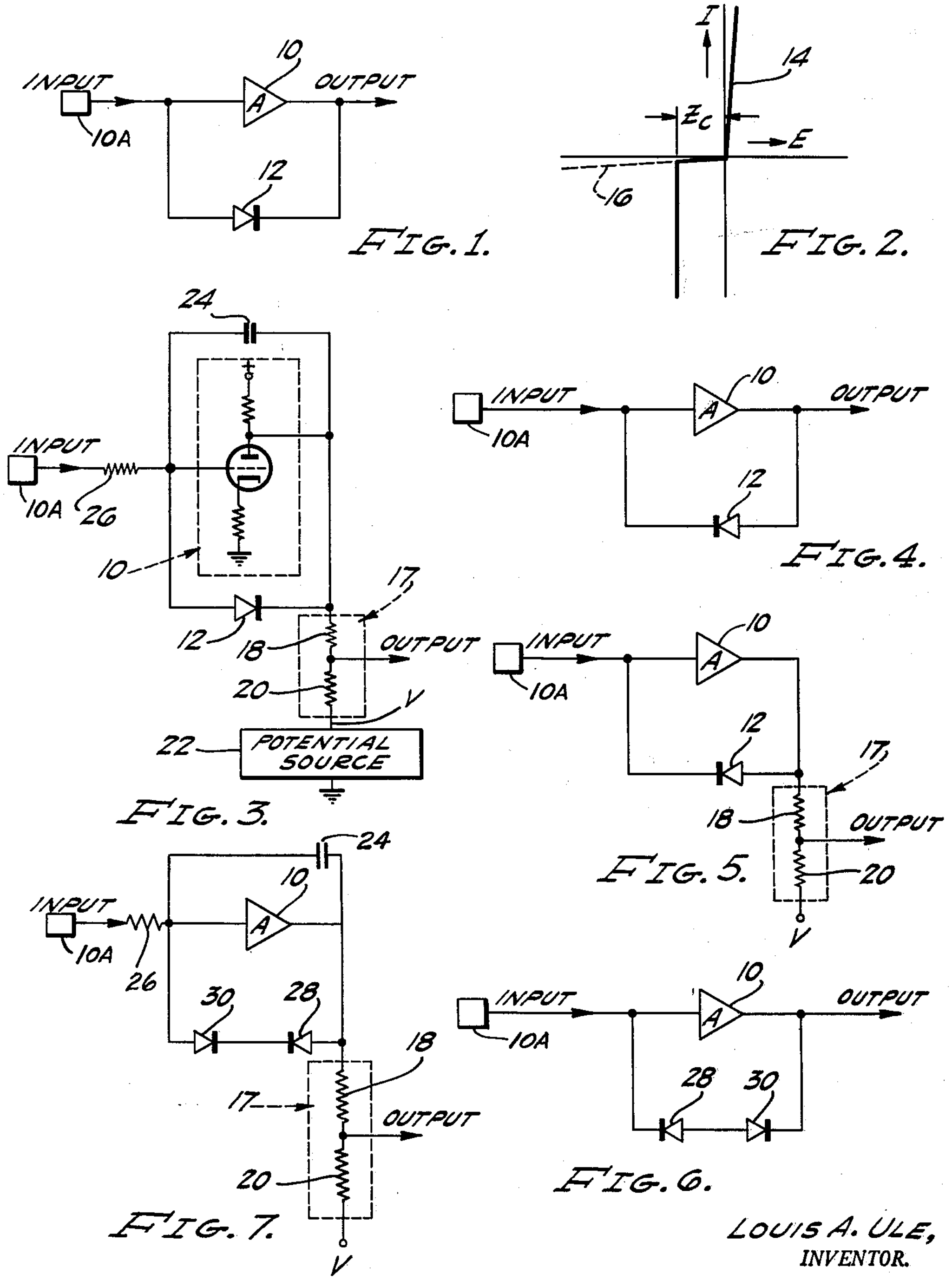
FIG. 1 is a diagrammatic view of one embodiment of the invention.
FIG. 2 is a graph of a voltage current characteristic of a Zener diode.
FIG. 3 is a schematic diagram of the embodiment of the invention shown in FIG. 1 with a level shifting device.
FIG. 4 is a diagrammatic view of an embodiment of the invention analogous to that shown in FIG. 1.
FIG. 5 is a diagrammatic view of the embodiment of the invention shown in FIG. 4 with the level shifting device.
FIGS. 6, 7, 8 and 9 are diagrammatic views of still other embodiments of the invention.

In the drawings in FIG. 1 an amplifier 10 is shown with a Zener diode 12 and a variable direct current potential source 10A which is employed to produce a voltage varying to an extent sufficient to cause break down of Zener diode 12 in a back-biased condition. The Zener diode 12 prevents the output of the amplifier 10 from exceeding a predetermined positive limit equal to $-Z_c$, the negative reverse voltage of the Zener diode 12 at which it conducts heavily. The voltage $Z_c$ thus is negative itself. The Zener diode 12 in addition prevents the output of the amplifier 10 from rising to any positive value. This is based on the assumption that the gain of the amplifier 10 is relatively high. For example, if the output of the amplifier 10 is $E_o$ and the input is $E_1$, $E_o - E_1 > -Z_c$ can never exist if $E_1$ is negative and the gain of amplifier 10 is high. In addition, the following conditions must exist:

$$(E_o - E_1)_{max} \leq -Z_c$$

and $$E_o >> E_1$$

where $(E_o - E_1)_{max}$ is the maximum difference between $E_o$ and $E_1$. Hence $E_o$ must always be approximately equal to or smaller than $-Z_c$ when $E_1$ is negative.

The Zener diode 12 operates as a conventional diode when $E_1$ is positive. Thus $E_o - E_1 \geq 0$ or $E_o$ must be approximately equal to or larger than zero. Combining the conditions of $E_1$ both negative and positive, the following is found:

$$0 \leq E_o \leq -Z_c \quad (1)$$

This may be better understood with reference to FIG. 2 where the voltage-current characteristic of the Zener diode 12 is indicated at 14. The voltage current characteristic of a conventional diode is illustrated at 16. The current is represented by I and voltage is represented by E. From Equation 1 it is seen that by use of the Zener diode with an amplifier, the output of the amplifier may be restricted to a definite range of values without the use of a separate and isolated bias source serially connected with the Zener diode 12. Although it is not obvious from the single diagrammatic view of FIG. 1, this arrangement is very versatile. For example Zener diodes can be constructed with a reverse critical voltage $Z_c$ within a range from five to six hundred volts. The amplifier output voltages at which Zener diodes conduct heavily in their back-biased condition may, of course, be altered by level shifting networks. That is, Equation 1 may be rewritten:

$$A \leq E_o \leq B \quad (2)$$

where A and B are constants dependent not only upon the critical voltage of the Zener diode 12 but of other constants in a circuit such as that illustrated in FIG. 3.

Specifically, in FIG. 3 the more important structures added to those shown in FIG. 1 include a level shifting network 17 including a resistor 18 connected from the output side of the amplifier 10 to a resistor 20. The mutual junctions of the resistors 18 and 20 provide the composite output of the circuit. The opposite end of the resistor 20 is connected to a potential source 22 which may be referenced to the same reference potential of the amplifier 10, e.g. ground. The circuit of FIG. 1 has also been modified somewhat further in FIG. 3 in that the amplifier 10 is employed as an integrator including an integrating capacitor 24 and an input resistor 26. Thus, to provide appropriate feedback, the resistance of resistor 26 is preferably large in comparison to that of the Zener diode 12 when a forward bias is impressed upon diode 12 or when a reverse bias is impressed upon it larger than the critical bias $Z_c$. It is seen that the voltage supplied to the level shifting network 17 by source 22 is positive with respect to ground, both A and B of Equation 2 will be positive. If the potential supply of the source 22 is negative, A will be negative and B may be positive or negative, depending upon the magnitude of the voltage supplied by source 22. In Equation 2, by definition, B must be larger than A. Hence with the use of the circuit of FIG. 3, any desired operative range difference, i.e. $(B-A)$, may be provided with a Zener diode and a level shifting network.

It is to be noted that the Zener diode 12 need not necessarily be poled in the direction shown in FIGS. 1 and 3. For example, the Zener diode 12 can be poled in the opposite direction as shown in FIG. 4. In this case A of Equation 2 is equal to $Z_c$, where $Z_c$ is considered negative, and $B=0$. The level shifting network 17 may also be employed with the circuit shown in FIG. 4 as illustrated in FIG. 5 where potential source 22 has been omitted, the reference potential of resistor 20 being indicated as V. When V is positive, A of Equation 2 may be positive or negative, depending upon the magnitude of V, and B will be positive. When V is negative, both A and B will be negative.

Still another alternative embodiment of the invention is shown in FIG. 6 where the amplifier 10 is provided with a feedback path including not one, but two Zener diodes 28 and 30 poled in opposite directions. In this case A of Equation 2 equals $Z_{c1}$ and B equals $-Z_{c2}$, where $Z_{c1}$ and $Z_{c2}$ are respectively the critical Zener voltages of diodes 28 and 30. In this case, variable potential source 10A may be employed to produce positive and negative voltages at different times of sufficient amplitudes to break down diodes 28 and 30, respectively.

It is obvious that the diodes 28 and 30 may be reconnected serially as shown in FIG. 7 to provide the same result. In addition, as shown in FIG. 7, level shifting network 17 may be employed with a reference potential V to change A and B of Equation 2 from $Z_{c1}$ and $-Z_{c2}$, respectively. For example, when V is positive A may be positive or negative, depending upon the magnitude of V, and B will be positive. When V is negative, A will be negative and B may be positive or negative, this also depending upon the magnitude of V.

Figure 8:
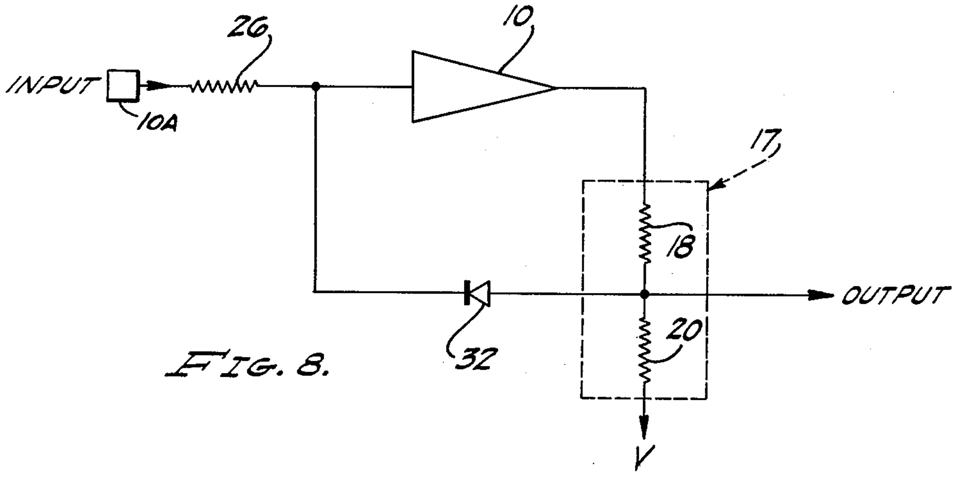

In FIG. 8 a Zener diode 32 is connected from the output of level shifting network 17 to the input of amplifier 10. Thus A and B from Equation 2 are equal, respectively, to $Z_{c3}$ and zero, where $Z_{c3}$ is the Zener voltage of diode 32. If diode 32 is poled in the direction opposite that shown, A and B are equal, respectively, to zero and $-Z_{c3}$. V may be positive or negative.

Figure 9:
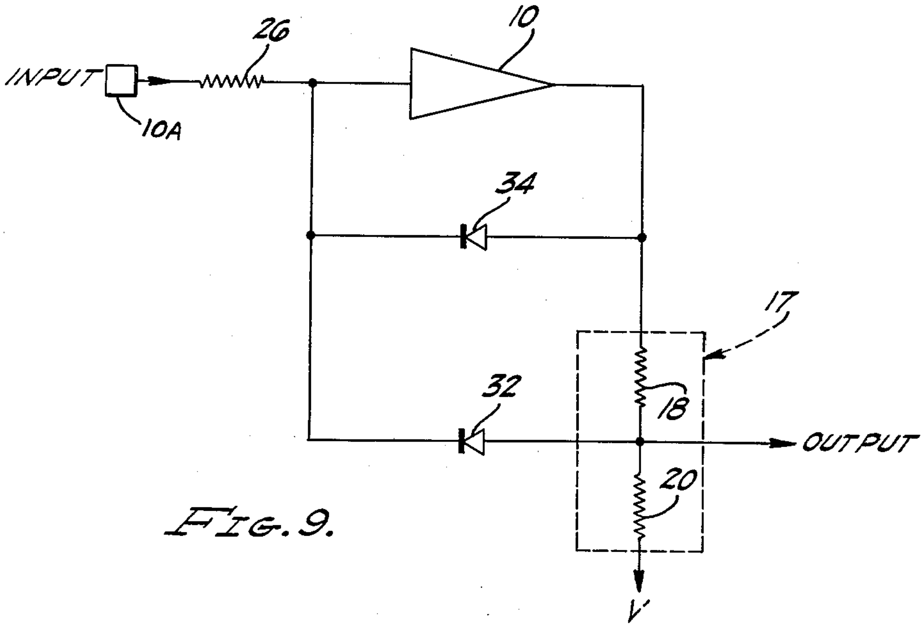

In FIG. 9 Zener diode 32 is connected in the same manner as in FIG. 8; however, a second diode 34 is also connected directly from the output to the input of amplifier 10. In this case $$A = Z_{c3}$$

$$B = \frac{VR_1}{R_1 + R_2}$$

where $R_1$ is the resistance of resistor 18, and
$R_2$ is the resistance of resistor 20.

If the diodes 32 and 34 are both poled in opposite directions, $$A = \frac{VR_1}{R_1 + R_2}$$

and $$B = -Z_{c3}$$

It is unnecessary for diode 34 to be a Zener diode. If it is, its Zener voltage should be more negative than $Z_{c3}$. The resistance of input resistor 26 in both FIGS. 8 and 9 is also preferably substantially greater than $R_1$.

It will also be obvious that other similar and analogous changes and modifications of the invention may be made by those skilled in the art without departing from the true scope of the invention as defined in the appended claims.

What is claimed is:

1. A signal translation device comprising: an amplifier having a direct-coupled feedback path and a pair of Zener diodes poled in opposite directions connected serially with each other in said feedback path.

2. The invention as defined in claim 1, wherein means are provided to operate both of said Zener diodes at their Zener breakdown voltages at least a portion of the time.

3. In an amplifier, the combination comprising: an electron discharge device having input, output and reference electrodes; a potential source for impressing a varying signal upon said input electrode; means for applying a constant signal between said output and reference electrodes; and a pair of Zener diodes poled in opposite directions connected serially with each other from said output electrode to said input electrode.

References Cited in the file of this patent

UNITED STATES PATENTS

| | | |
|---|---|---|
| 2,655,608 | Valdes | Oct. 13, 1953 |
| 2,747,111 | Koch | May 22, 1956 |
| 2,785,236 | Bright et al. | Mar. 12, 1957 |
| 2,789,761 | Merrill | Apr. 23, 1957 |
| 2,832,886 | Morrill | Apr. 29, 1958 |

OTHER REFERENCES

"Electronic Analog Computers," Korn and Korn, 1952, McGraw-Hill Book Company, New York; pages 276–277 relied on.